(12) United States Patent
Meagley et al.

(10) Patent No.: US 7,018,920 B2
(45) Date of Patent: Mar. 28, 2006

(54) COMPOSITE SACRIFICIAL MATERIAL

(75) Inventors: Robert P. Meagley, Hillsboro, OR (US); Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/985,510

(22) Filed: Nov. 10, 2004

(65) Prior Publication Data

US 2005/0124152 A1 Jun. 9, 2005

Related U.S. Application Data

(62) Division of application No. 10/393,063, filed on Mar. 20, 2003, now Pat. No. 6,858,528.

(51) Int. Cl.
*H01L 21/4763* (2006.01)
(52) U.S. Cl. .............. 438/629; 438/627; 148/33.3; 257/758
(58) Field of Classification Search .............. 438/629, 438/637, 638, 668, 672, 675; 148/33.3; 257/758
See application file for complete search history.

(56) References Cited

U.S. PATENT DOCUMENTS

| | | | | |
|---|---|---|---|---|
| 5,705,430 | A * | 1/1998 | Avanzino et al. | 438/618 |
| 5,981,354 | A * | 11/1999 | Spikes et al. | 438/424 |
| 6,042,999 | A * | 3/2000 | Lin et al. | 430/316 |
| 6,214,248 | B1 * | 4/2001 | Browning et al. | 216/56 |
| 6,365,529 | B1 * | 4/2002 | Hussein et al. | 438/780 |
| 6,406,995 | B1 * | 6/2002 | Hussein et al. | 438/638 |
| 6,424,039 | B1 * | 7/2002 | Wang et al. | 257/750 |
| 6,448,177 | B1 * | 9/2002 | Morrow et al. | 438/638 |
| 6,680,262 | B1 * | 1/2004 | Andideh et al. | 438/780 |
| 6,689,695 | B1 * | 2/2004 | Lui et al. | 438/700 |
| 2003/0219968 | A1 * | 11/2003 | Adem et al. | 438/622 |

* cited by examiner

*Primary Examiner*—George Fourson
*Assistant Examiner*—Fernando L. Toledo
(74) *Attorney, Agent, or Firm*—Trop, Pruner & Hu, P.C.

(57) ABSTRACT

A composite sacrificial material is deposited in a void or opening in a dielectric layer on a semiconductor substrate. The composite sacrificial material includes a polymeric or oligomeric matrix with filler material mixed therein. The filler material may be particulate matter that may be used to modify one or more properties of the composite sacrificial material during semiconductor processing.

10 Claims, 3 Drawing Sheets

COMPOSITE SACRIFICIAL MATERIAL

This application is a divisional of prior application Ser. No. 10/393,063, filed on Mar. 20, 2003 now U.S. Pat. No. 6,858,528.

BACKGROUND

The present invention relates generally to the field of integrated circuit manufacturing, and more specifically, to depositing and removing sacrificial material from voids or openings in a dielectric layer on a semiconductor substrate.

Sacrificial material has been used in integrated circuit manufacturing to fill voids or openings in a dielectric layer on a semiconductor substrate. For example, sacrificial material has been used in processes for providing dual damascene metal interconnects in integrated circuits. Sacrificial material allows the lithography and etching process to effectively apply to a substantially hole-free surface, similar to a surface without voids or openings.

One type of sacrificial material is sacrificial light absorbing material (SLAM), which includes or is associated with a light absorbing material or dye so that it acts as an anti-reflective coating during the lithography process. By dyeing the sacrificial material, changes in substrate reflectivity may be reduced, enabling the photolithographic process to produce improved results.

Sacrificial material generally has been a spin-on-polymer (SOP) or spin-on-glass (SOG) deposited by spin coating to fill openings in the dielectric layer. For example, sacrificial material may consist of a solution of low molecular weight organosilicate polymer and small molecule additives such as reaction catalysts, surfactant and co-solvent, and an organic chromophore or dye to absorb incident light and minimize reflection.

The dual damascene concept involves forming both a via and a trench in the dielectric layer or interlayer dielectric (ILD). For example, the via may be etched first. Sacrificial material may be spin-coated onto a patterned substrate, i.e., a wafer with vias patterned into an exposed dielectric material. After spin-coating, the sacrificial material should fill the vias completely and provide a defect-free planar surface on the wafer, and leave between about 500 and 3,000 angstroms of the material on the surface of the device.

After filling the vias, the sacrificial material may be baked to crosslink the polymer network, forming a carbon-containing silicate glass having a dry etch rate similar to the dielectric. A photoresist then may be coated over the substrate, and a trench may be etched, removing sacrificial material at about the same rate as the dielectric layer.

After the trench is etched, residual photoresist may be removed by ashing. During ashing, carbon in the sacrificial material is oxidized, breaking off the polymer network and evolving as waste gases such as carbon dioxide, water, etc. As a result, sacrificial material may change from a carbon-containing silicate glass to a weakened low carbon-silicate glass. Any remaining sacrificial material may be removed by a combination of plasma processing and wet chemistry steps. The via and trench then are filled with a conductive material such as copper to form a conductive layer of interconnects.

Sacrificial material has several properties including anti-reflection, dry etch rate, planarization and cleaning properties. However, these properties have not been controlled except through changes to the organosilicate polymer and, to a limited extent, the casting solvent and additives such as surfactant. However, optimizing one property, such as gap-fill, may be sub-optimal for other properties, such as the dry etch rate. Properties of the sacrificial material have not been optimized independently. Additionally, some organic dyestuffs used for light-absorption may not be phase compatible with organosilicate or other matrix materials and can present additional difficulties such as migration into adjacent photoresist layers.

There is a need to optimize properties of sacrificial material independently. There is a need for sacrificial material with improved gap-fill properties without increasing the dry etch rate or adversely affecting other properties, especially on substrates having significant topography. There is a need for an improved sacrificial material to fill voids or openings in a dielectric layer in dual damascene or similar processes in semiconductor manufacturing, especially in sub 0.25 micron structures.

DETAILED DESCRIPTION

Set forth below is a description of several embodiments of the present invention, presented in the context of a semiconductor device that includes a copper containing dual damascene interconnect. The description is made with reference to FIGS. 1a–1d and FIGS. 2a–2d which illustrate cross-sections of structures that result after using certain steps according to certain embodiments of the invention. Although a dual damascene interconnect is described, it will be understood that the present invention also may be used in the context of other semiconductor devices, including but not limited to single damascene processes, in which composite sacrificial material may be used to fill voids or openings in a dielectric layer.

Figure 1A:
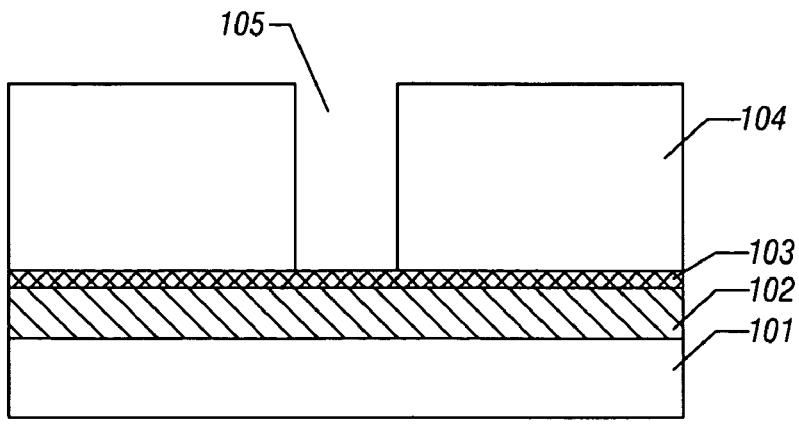
FIGS. 1a–1d illustrate cross-sections that reflect structures that may result after certain steps are used to make a copper containing dual damascene device following one embodiment of the present invention.

FIG. 1a shows substrate 101 with first conductive layer 102, barrier layer 103, and dielectric layer or interlayer dielectric (ILD) 104. The substrate may be any surface, generated when making an integrated circuit, upon which a conductive layer may be formed. The substrate thus may include, for example, active and passive devices that are formed on a silicon wafer such as transistors, capacitors, resistors, diffused junctions, gate electrodes, local interconnects, etc. The substrate also may include insulating materials (e.g., silicon dioxide, either undoped or doped with phosphorus (PSG) or boron and phosphorus (BPSG); silicon nitride; silicon oxynitride; or a polymer) that separate such active and passive devices from the conductive layer or layers that are formed on top of them, and may include previously formed conductive layers.

The first conductive layer preferably comprises copper, and may be formed using a conventional copper electroplating process, in which a copper layer is formed on barrier and seed layers. The first conductive layer also may be made from other materials conventionally used to form conductive layers for integrated circuits. For example, the first conductive layer may be made from a copper alloy, aluminum or an aluminum alloy, such as an aluminum/copper alloy. Alternatively, the first conductive layer may be made from doped polysilicon or a silicide, e.g., a silicide comprising tungsten, titanium, nickel or cobalt. The first conductive layer may include a number of separate layers. For example, the first conductive layer may comprise a primary conductor made from an aluminum/copper alloy that is sandwiched between a relatively thin titanium layer located below it and a titanium, titanium nitride double layer above it. The first conductive layer may be formed by a chemical vapor or physical deposition process, like those that are well known to those skilled in the art. If copper is used to make the first conductive layer, a conventional copper electroplating process may be used. Although a few examples of the types of materials that may form the first conductive layer have been identified here, it may be formed from various other materials that can serve to conduct electricity within an integrated circuit. Although copper is preferred, the use of any other conducting material, which may be used to make an integrated circuit, falls within the spirit and scope of the present invention.

The barrier layer may be made from silicon nitride, but also may be made from other materials such as silicon oxynitride or silicon carbide, as is well known to those skilled in the art. When formed from silicon nitride, a chemical vapor deposition process may be used to form the barrier layer. The barrier layer may serve to prevent an unacceptable amount of copper, or other metal, from diffusing into other layers, and also may act as an etch stop to prevent subsequent via and trench etch steps from exposing the first conductive layer to subsequent cleaning steps. The barrier layer should be thick enough to perform its diffusion inhibition and etch stop functions, but not so thick that it adversely impacts the overall dielectric characteristics resulting from the combination of the barrier layer and the dielectric layer overlying the barrier layer. The thickness of the barrier layer preferably should be less than about 10% of the thickness of the overlying dielectric layer, and preferably between about 100 and 500 angstroms thick.

In one embodiment, the dielectric layer has a dielectric constant lower than 3.9 which is the dielectric constant of silicon dioxide. For example, the dielectric layer may comprise plasma enhanced chemical vapor deposition (PECVD) silicon dioxide doped with carbon, having a dielectric constant of approximately 2.2 to 2.6. Other materials that may be used for the dielectric layer include materials that may insulate one conductive layer from another, and preferably those materials having dielectric constants below that of silicon dioxide, and most preferably materials with dielectric constants below 3.0. For example, the dielectric layer may comprise fluorinated silicon dioxide or organic polymers selected from the group that includes polyimides, parylenes, polyarylethers, polynaphthalenes, and polyquinolines, or copolymers thereof. The dielectric layer preferably has a thickness of between about 2,000 and about 20,000 angstroms.

In one embodiment of the invention, as shown in FIG. 1a, via 105 is etched into the dielectric layer. To etch the via, a photoresist layer may be patterned on top of the dielectric layer to define the via formation region, using conventional photolithographic techniques, such as masking a layer of photoresist, exposing the masked layer to light, then developing the unexposed portions. Alternatives to photoresist also may be used, including a bi- or multi-layer photolithographic process, imprinting, electron beam, x-ray atomic force microscopy (AFM), or other forms of advanced lithography. Conventional process steps for etching through a dielectric layer may be used to etch the via, e.g., a conventional anisotropic dry oxide etch process. For example, the via may be etched using a medium density magnetically enhanced reactive ion etching system (MERIE system) using fluorocarbon chemistry, or a forming gas chemistry, e.g., one including nitrogen and either hydrogen or oxygen.

Figure 1B:
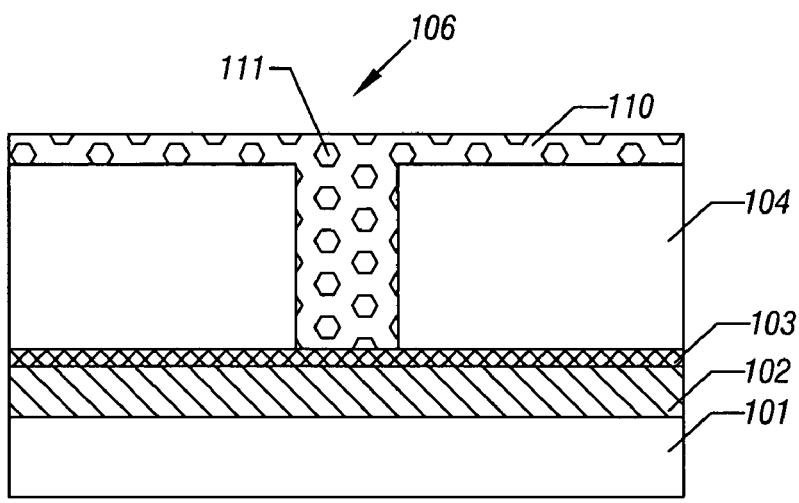

As shown in FIG. 1b, composite sacrificial material 106 is used to fill via 105. In one embodiment, the composite sacrificial material may be deposited by spin coating between about 500 and about 3,000 angstroms of the material onto the surface of the device. The spin coating process causes the composite sacrificial material to substantially or completely fill the via, with a thin layer of the material on the surface of the device.

Composite sacrificial material 106 is a multi-phase and multi-component mixture including at least the following two components: (a) matrix material 110; and (b) filler material 111. Optionally, the composite sacrificial material also may include additional components such as small molecule additives such as solvents, dyestuffs, surfactants, catalysts, etc.

Matrix material 110 of the composite sacrificial material 106 may include oligomeric or polymeric materials, organosilicates (including hydrosilsesquioxanes (HSQ), methylsilsesquioxanes (MSQ) and other silsesquioxane (SSQ) materials), organotitanates, organozirconates, other ceramics and glasses, polyimide, polyimide precursors, polybenzoxazole (PBO), PBO precursors, polyacrylates, polymethacrylates, alicylic polymers, polyolefins, benzocyclobutene (BCB), BCB precursors, fluorinated derivatives of BCB, polycarbonates, epoxies, and other engineering polymers.

Filler material 111 may be organic or inorganic particles that are solid or semi-solid, and may be any shape with maximum dimensions of less than 100 nanometers. Preferably, the maximum dimensions of each filler particle 111 should be less than the size of a void or opening in a dielectric layer where the composite sacrificial material may be introduced. In one embodiment, the maximum particle size is less than 30 nanometers. In one embodiment, the filler particles may be in the composite sacrificial material during etching or other processes in which the composite sacrificial material is removed.

In one embodiment, filler material 111 may be surface-functionalized inorganic particulate material such as silanol-functionalized clay. In another embodiment, filler material 111 may be polymer particles. The polymer particles may be added discretely in formulation or may be formed in situ during formulation or application to the substrate. In other embodiments, filler material 111 may constitute organic particulate materials such as carborane clusters (including closo-, hapto-, and nido-forms), silica, zirconia, titania, alumina, other ceramic and/or glass particles (hollow and solid), polymers (including hyperbranched and dendritic), crosslinked polymer particles, polymer blends, carbon and/or its allotropes (carbon fiber, nanotubes, buckyballs, etc.), fluoropolymers and halogenated polymers, polymers with high oxygen content, and thermally decomposable polymers.

In one embodiment, the composite sacrificial material includes an organosilicate polymer matrix with inorganic filler material such as carborane ($C_nB_M$), zirconia ($ZrO_2$) or titania ($TiO_2$), and an optional dyestuff.

In one embodiment, composite sacrificial material 106 may have improved etch resistance over conventional sacrificial material lacking filler material. For example, the composite sacrificial material in one embodiment may have etch resistance to match or be similar to the etch rate of dielectric materials having a low dielectric constant (k). In other embodiments, the composite sacrificial material may promote cleaning because the filler material may act as a solubility promoter, surfactant, or thermally decomposable material. In another embodiment, composite sacrificial material may include filler material such as titania to provide light absorption properties instead of conventional light absorption additives such as organic dyestuffs.

Formulating the composite sacrificial material by mixing filler material in a matrix provides significantly greater flexibility in adjusting the properties of the material to meet processing and design targets. For example, in one embodiment, the quantity or amount of filler material may be adjusted to modify the dry etch rate of the composite sacrificial material. Similarly, the light absorption, planarization, and removal properties of the composite sacrificial material may be modified by increasing or decreasing the loading of filler material.

In some embodiments, alternative matrix materials other than organosilicates may be used, so that the combination of the matrix and filler may be tailored to have properties to meet specific processing needs. For example, in one embodiment, organic polymer matrices with fumed silica filler particles may be used as composite sacrificial material for porous or polymer dielectric materials having low dielectric constants (k). Such a composite sacrificial material may be configured to have a high dry etch rate, for example. In another embodiment, titanate matrices with silica filler particles may be used as composite sacrificial material having high light absorbance and good etch resistance.

In one embodiment, the composite sacrificial material is made by mixing filler material in a liquid or semi-liquid matrix that may be spin-coated on a substrate surface. Preferably, the filler material is not chemically bonded to the matrix when the composite sacrificial material is formulated or coated on the substrate.

However, in one embodiment, the filler material may have surface functionality to chemically react to form bonds with the oligomeric or polymeric matrix material during certain steps in fabrication or processing of a semiconductor substrate. For example, during partial bake and/or post-bake steps in semiconductor fabrication, filler material may bond with carbon-based functional groups or oxygen atoms in an organosilicate matrix. Depending on the filler material used and the parameters of the ashing process, some or all of the filler-matrix bonds may remain intact during and/or after the ashing process, or may be broken by the ashing process if desired.

Figure 1C:
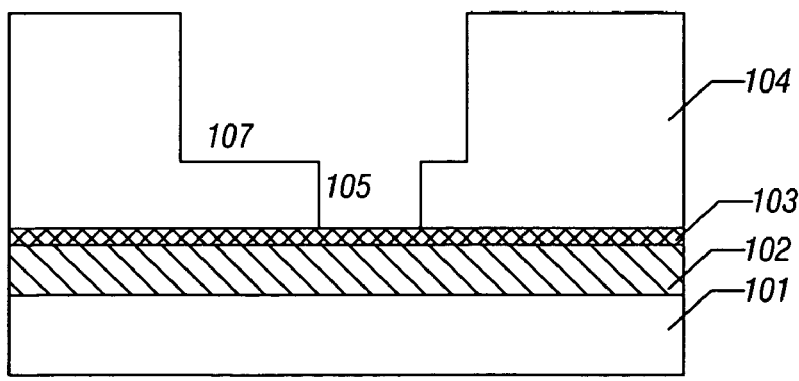

In one embodiment, as shown in FIG. 1c, trench 107 may be formed in the dielectric layer by lithographic and dry etch process steps. The etching process is applied for a time sufficient to form an opening in the dielectric layer and at least partially into the composite sacrificial material to a desired depth. The trench etching process may remove some or all of the composite sacrificial material from the via. After etching the trench, any remaining composite sacrificial material may be cleaned out and removed from the via by a combination of plasma processing and wet chemistry steps, or other methods well known to those skilled in the art.

Figure 1D:
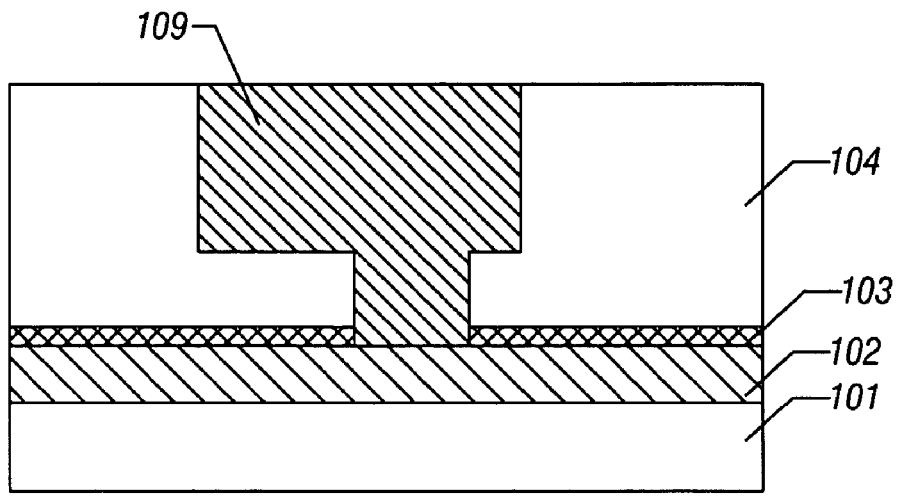

In one embodiment, as shown in FIG. 1d, the trench and via then may be filled with second conductive layer 109. A portion of the barrier layer that separates the via from the first conductive layer may be removed to expose the first conductive layer. A CMP step may be used to remove excess conductive material and planarize the surface of the second conductive layer. Although FIG. 1d shows only one dielectric layer and two conductive layers, the process described above may be repeated to form additional conductive and insulating layers until the desired integrated circuit is produced.

Figure 2A:
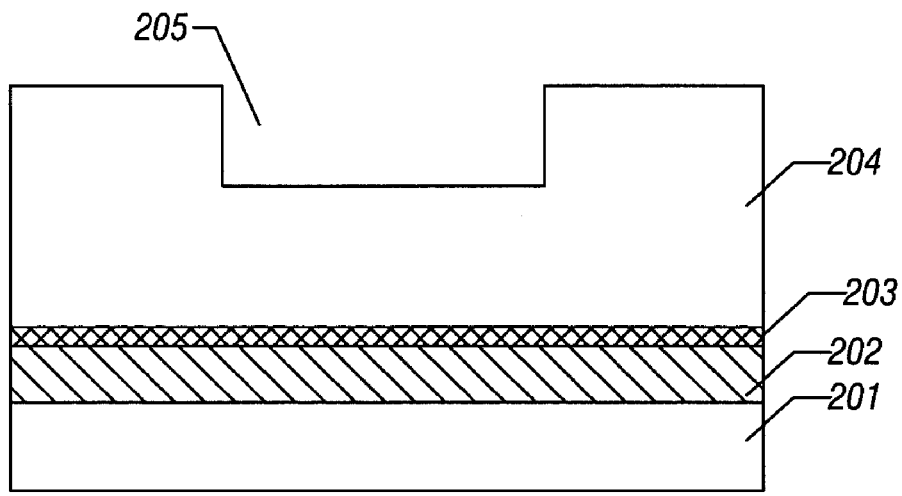
FIGS. 2a–2d illustrate cross-sections that reflect structures that may result after certain steps are used to make a copper containing dual damascene device following a second embodiment of the present invention.
Figure 2B:
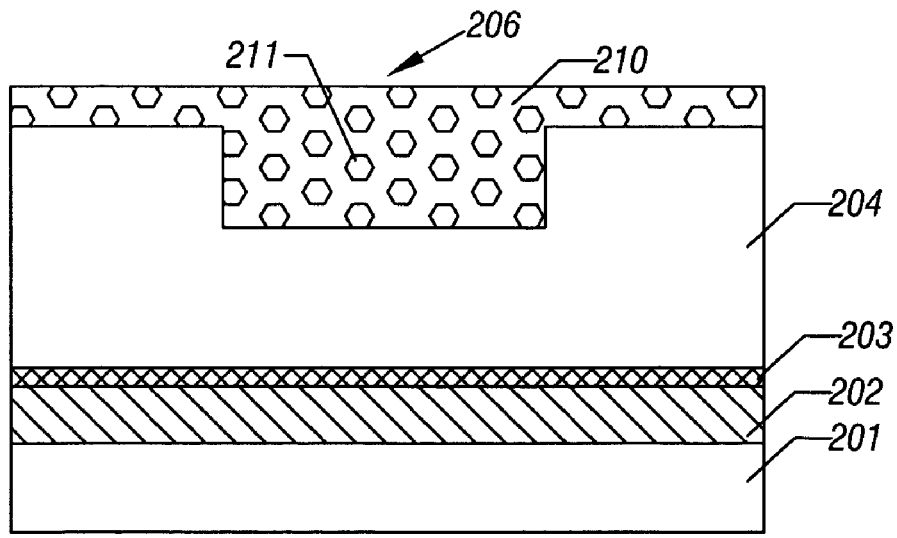

FIGS. 2a–2d represent structures that may be formed when applying a second embodiment of the present invention. FIG. 2a shows a structure similar to the one shown in FIG. 1a, including substrate 201, first conductive layer 202, barrier layer 203, and dielectric layer 204, except that trench 205 is formed in the dielectric layer. As shown in FIG. 2b, composite sacrificial material 206 may be applied to the device, e.g., by spin coating it onto the device's surface, to fill the trench and also create a substantially planar surface over the device. The composite sacrificial material includes matrix 210 and filler material 211.

Figure 2C:
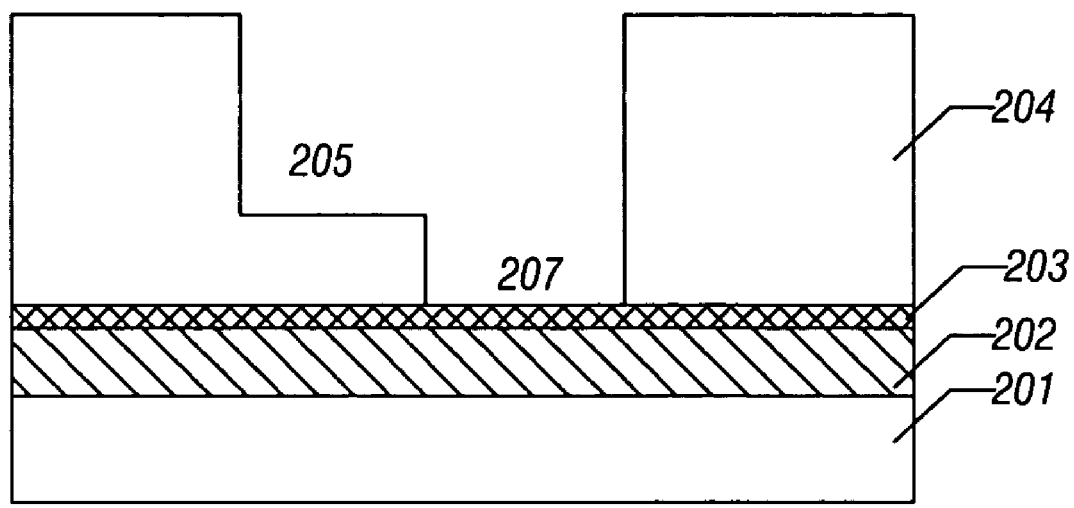
Figure 2D:
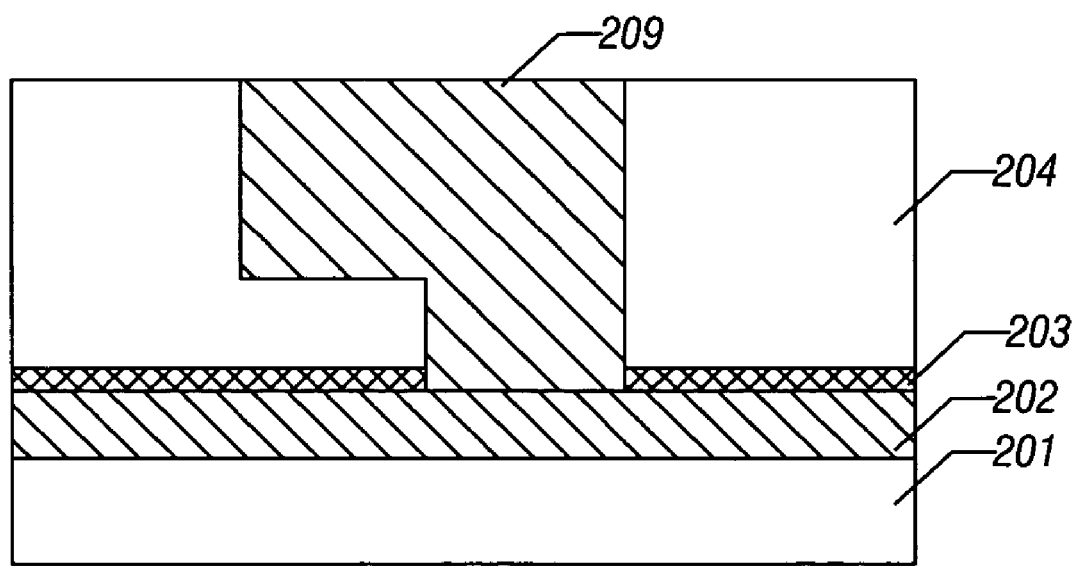

As shown in FIG. 2c, via 207 is then patterned and etched through the exposed portion of the composite sacrificial material and through the underlying portion of the dielectric layer. After etching the via, any remaining composite sacrificial material may be removed from the trench by known methods. In FIG. 2d, second conductive layer 209 is then applied to fill the via and trench, which then may be planarized.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a semiconductor substrate having a conductive layer, a barrier layer over the conductive layer, and a dielectric layer over the barrier layer;
   a first opening and a second opening etched into the dielectric layer, at least one of the openings extending through the dielectric layer to the barrier layer; and
   a composite sacrificial material in at least one of the first and second openings, the composite sacrificial material including particulate filler material in a liquid matrix, said filler material includes at least one of polymer particles, titanium, carborane, or zirconia.

2. The apparatus of claim 1 wherein the first opening is a via and the second opening is a trench in a dual damascene interconnect.

3. The apparatus of claim 1 wherein the dielectric layer has a dielectric constant below 3.9.

4. The apparatus of claim 3 wherein the dielectric layer has a dielectric constant in the range of 2.2 to 2.6.

5. The apparatus of claim 1 wherein the composite sacrificial material is light absorbing.

6. The apparatus of claim 1 wherein the particulate filler material is surface functionalized inorganic particulate material.

7. The apparatus of claim 1 wherein the particulate filler material is polymer particles.

8. The apparatus of claim 1 wherein the particulate filler material is titania.

9. The apparatus of claim 1 wherein the particulate filler material is carborane.

10. The apparatus of claim 1 wherein the particulate filler material is zirconia.

* * * * *